(12) United States Patent
Kim

(10) Patent No.: US 7,803,661 B2
(45) Date of Patent: Sep. 28, 2010

(54) FLIP CHIP LASER BONDING PROCESS

(75) Inventor: Sung-Wook Kim, Seoul (KR)

(73) Assignee: Samsung Techwin Co., Ltd., Changwon-si (KR)

( * ) Notice: Subject to any disclaimer, the term of this patent is extended or adjusted under 35 U.S.C. 154(b) by 0 days.

(21) Appl. No.: 11/974,783

(22) Filed: Oct. 16, 2007

(65) Prior Publication Data

US 2008/0268571 A1    Oct. 30, 2008

(30) Foreign Application Priority Data

Apr. 24, 2007   (KR) .............. 10-2007-0039741

(51) Int. Cl.
    *H01L 21/44*   (2006.01)
(52) U.S. Cl. ............... 438/108; 438/800; 257/E21.503
(58) Field of Classification Search .................. 438/108
    See application file for complete search history.

(56) References Cited

U.S. PATENT DOCUMENTS

| | | | | |
|---|---|---|---|---|
| 5,250,781 A | * | 10/1993 | Kanda et al. | 219/121.63 |
| 5,305,944 A | * | 4/1994 | Yoshida et al. | 228/180.22 |
| 5,495,089 A | * | 2/1996 | Freedman et al. | 219/121.64 |
| 5,500,502 A | * | 3/1996 | Horita et al. | 219/121.63 |
| 5,548,890 A | * | 8/1996 | Tada et al. | 29/827 |
| 5,648,005 A | * | 7/1997 | Cobb et al. | 219/411 |
| 5,829,125 A | * | 11/1998 | Fujimoto et al. | 29/840 |
| 5,984,165 A | * | 11/1999 | Inoue et al. | 228/180.22 |
| 6,072,148 A | * | 6/2000 | Azdasht | 219/121.63 |
| 6,204,471 B1 | * | 3/2001 | Kurihara | 219/121.62 |
| 6,353,202 B1 | * | 3/2002 | Grotsch et al. | 219/121.63 |
| 2003/0228723 A1 | * | 12/2003 | Yamazaki et al. | 438/164 |
| 2004/0208206 A1 | * | 10/2004 | Tanaka | 372/23 |
| 2007/0037318 A1 | * | 2/2007 | Kim | 438/106 |

FOREIGN PATENT DOCUMENTS

| | | |
|---|---|---|
| JP | 2002-141376 A | 5/2002 |
| WO | WO 00/41834 A1 | 7/2000 |

OTHER PUBLICATIONS

Office Action established for CN 200710305149.0.

* cited by examiner

*Primary Examiner*—W. David Coleman
(74) *Attorney, Agent, or Firm*—Drinker Biddle & Reath LLP

(57) ABSTRACT

An apparatus for heating a chip includes: a laser generator for emitting a laser beam to a semiconductor chip to heat the semiconductor chip; and a beam intensity adjuster disposed on a laser emission path between the semiconductor chip and the laser generator to equalize the intensity of the laser beam to be emitted to the semiconductor chip. A flip chip bonder having the chip heating apparatus, and a method for bonding a flip chip using the same are also provided.

5 Claims, 9 Drawing Sheets

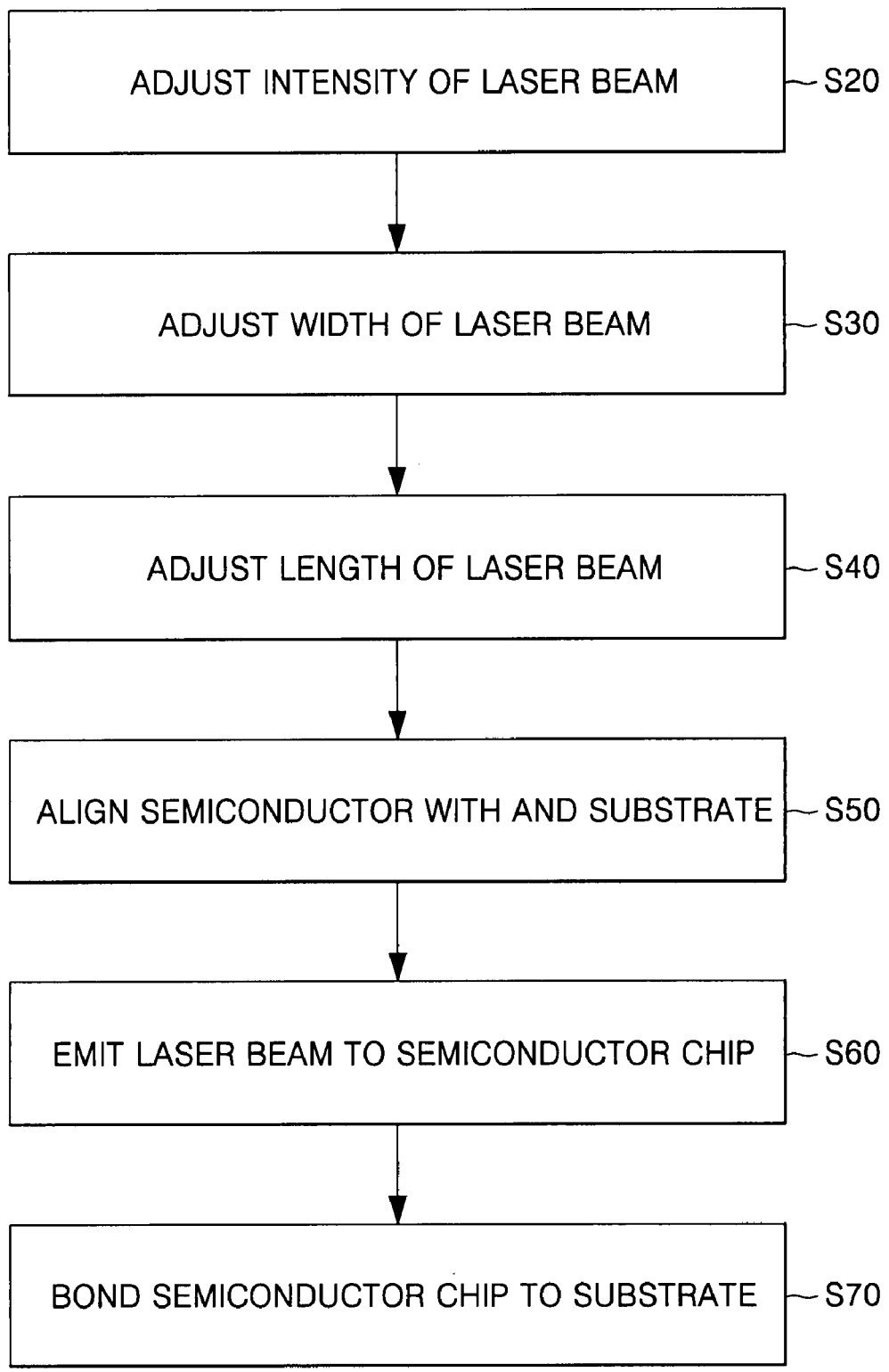

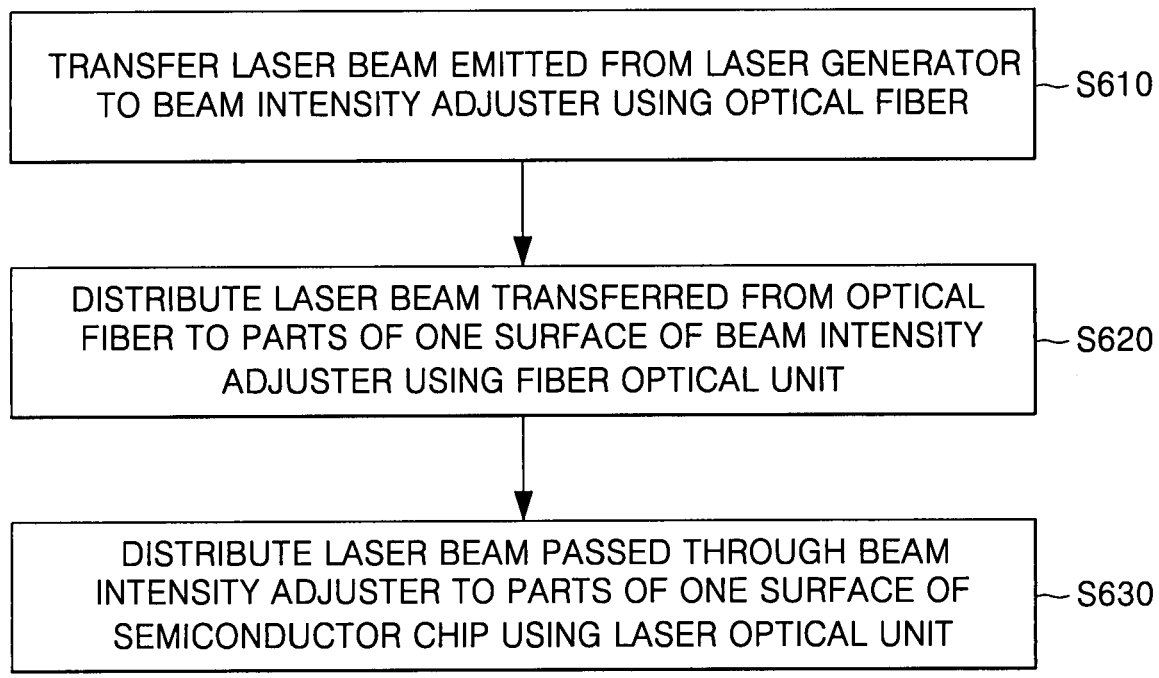

FLIP CHIP LASER BONDING PROCESS

CROSS-REFERENCE TO RELATED APPLICATION

This application claims the benefit of Korean Patent Application No. 2007-0039741, filed Apr. 24, 2007, the disclosure of which is hereby incorporated herein by reference in its entirety.

BACKGROUND OF THE INVENTION

1. Field of the Invention

The present invention relates to an apparatus and method for bonding a semiconductor chip on a substrate, and more particularly, to an apparatus for heating a semiconductor chip using a laser beam, a flip chip bonder having the apparatus, and a method for bonding a flip chip using the same.

2. Description of the Related Art

In recent times, electronic devices have become smaller in size but also have increased functionality, and accordingly tend to include a highly integrated and high performance semiconductor chip.

Likewise, to follow this trend, a semiconductor package that protects such a semiconductor chip from various exterior environmental factors, e.g., dust or moisture, electrical or mechanical load, etc., is manufactured to be lightweight, thin, simple and small and to have many pins.

Accordingly, a semiconductor packaging method such as a conventional wire bonding method is inadequate for newer semiconductor packages, and so new methods have been proposed. As one example of the new methods, there is a solder bump method.

In the solder bump method, a solder bump is separately formed on a pad used as input/output terminals of the semiconductor chip, and then the semiconductor chip is directly attached to a pattern of a carrier substrate or a circuit tape as it is flipped. Here, bonding is performed in the state that the semiconductor is flipped, and so this solder bump method is called "flip chip bonding."

The flip chip bonding methods are classified into a thermal compression method and a laser compression method.

In the case of the thermal compression method, the chip is moved to a bonding position so that the solder bumps are opposed to appointed solder bumps of the carrier substrate, and then a bonding material between the solder bumps of the chip and the solder bumps of the substrate is heated to a melting point for bonding both solder bumps, which is disclosed in Japanese Patent Publication No. 2002-141376.

However, the thermal compression method has to heat the semiconductor chip for a relatively long time because heat loss arises in a heat transfer part. As a result, it takes much time to reach a bonding temperature for the solder bump, and so productivity is reduced and it is impossible to use a material vulnerable to high temperature.

Further, in the thermal compression method, the bonding position may deviate slightly due to the difference in thermal expansion coefficients between the semiconductor chip and the carrier substrate, resulting in a reduction in bonding precision. Also, the semiconductor chip and the carrier substrate contract after cooling, introducing the risk of a crack or similar damage in the bonded part.

On the other hand, the laser compression method heats and compresses the back of the chip after the chip is moved to a bonding position so that the chip solder bumps are opposed to corresponding carrier substrate solder bumps, thereby bonding both solder bumps, which is disclosed in Korean Patent Publication No. 2001-0108103. The laser compression method has been widely used because it employs a laser as a heat source for heating the semiconductor chip, and achieves high productivity and relatively low thermal expansion in a relatively short time.

FIG. 1 is a cross-sectional view illustrating an example of a bonding head in a conventional flip chip bonder.

Referring to FIG. 1, the conventional flip chip bonder includes a bonding head 10 internally formed with a vacuum passage 12. The vacuum passage 12 has vacuum pressure by a vacuum pressure generator (not shown). Thus, the bonding head 10 picks up a semiconductor chip 80 by the vacuum pressure generated in the vacuum passage 12, and carries it to a bonding position.

Further, an optical fiber 11 is provided inside the vacuum passage 12 and transfers a laser beam to the semiconductor chip 80. The optical fiber 11 transfers the laser beam from a laser generator to the semiconductor chip 80, thereby heating the semiconductor chip 80 to a bonding temperature in a relatively short time.

Thus, the conventional flip chip bonder employs the vacuum pressure generated in the vacuum passage 12 to pick up the semiconductor chip 80 and carry it to the bonding position, and uses the laser beam transferred through the optical fiber 11 to heat the semiconductor chip 80 to the bonding temperature, thereby bonding the semiconductor chip 80 to a substrate.

However, in the conventional flip chip bonder, the laser beam for heating the semiconductor chip 80 to the bonding temperature is transferred through the optical fiber 11 without a separate medium and is directly emitted to the semiconductor chip 80, and so the laser beam is not uniformly emitted to the whole region of the semiconductor chip 80. As shown in FIG. 2, the laser beam is emitted with stronger intensity at the center region of the semiconductor chip 80 than at the surrounding region and periphery of the chip 80. As a result, energy distribution in the semiconductor chip is very uneven due to the laser beam, which may cause the semiconductor chip 80 to be damaged, bonding quality to be deteriorated, or similar problems.

In other words, as the laser beam 11 is directly emitted to the semiconductor chip 80 through the optical fiber 11 without a separate medium, the intensity of the laser beam emitted to the semiconductor chip 80 has a Gaussian profile, as shown in FIG. 2. With regard to energy being proportional to the beam intensity, a center region has high energy, but its surrounding region has low energy. Therefore, in the flip chip bonding, if the intensity and the amount of the laser beam are reduced with respect to the energy in the center region, there is an energy shortage in the surrounding region, thereby causing deterioration in the bonding quality. On the other hand, if the intensity and the amount of the laser beam are increased with respect to the energy in the surrounding region, excessive energy is applied to the center region, thereby causing the semiconductor chip 80 to be damaged or the like.

To solve the above-mentioned problems, a flip chip bonder as shown in FIG. 3 has recently been used.

FIG. 3 is a cross-sectional view illustrating another example of a bonding head in the conventional flip chip bonder.

Referring to FIG. 3, this flip chip bonder further includes a laser optical unit 16 for distributing the laser beam in addition to the elements of the foregoing flip chip bonder. The laser optical unit 16 is disposed between a bottom of a bonding head 15 by which the semiconductor chip 80 is sucked and an optical fiber 11 through which a laser beam is transferred to the semiconductor chip 80. The laser optical unit 16 distributes the laser beam transferred through the optical fiber 11 to parts on one surface of the semiconductor chip 80 facing the optical fiber 11.

Thus, when the semiconductor chip 80 to be flip-chip bonded is carried, this flip chip bonder picks up the semiconductor chip 80 by vacuum pressure of a vacuum passage 12 and carries it to a bonding position, and heats the semiconductor chip 80 to a bonding temperature with the laser beam transferred through the optical fiber 11 and distributed through the laser optical unit 16, thereby bonding it to a substrate.

However, this flip chip bonder also results in the intensity of the laser beam to the semiconductor chip 80 having a Gaussian profile, as shown in FIG. 4. With regard to energy being proportional to the beam intensity, a center region has high energy, but its surrounding region has low energy. Therefore, in the flip chip bonding, if the intensity and the amount of the laser beam are reduced with respect to the energy in the center region, there is an energy shortage in the surrounding region, thereby causing deterioration in the bonding quality. On the other hand, if the intensity and the amount of the laser beam are increased with respect to the energy in the surrounding region, excessive energy is applied to the center region, thereby causing the semiconductor chip 80 to be damaged or the like.

SUMMARY OF THE INVENTION

The present invention provides an apparatus for heating a chip, in which a laser beam is emitted to a semiconductor chip with uniform intensity, thereby uniformly heating the semiconductor chip.

Further, the present invention provides a flip chip bonder and a method for bonding a flip chip using the same, in which a laser beam is emitted to a semiconductor chip with uniform intensity, so that energy distribution of the laser beam is uniform in the semiconductor chip.

According to a first aspect of the present invention, an apparatus for heating a chip includes: a laser generator for emitting a laser beam to a semiconductor chip to heat the semiconductor chip; and a beam intensity adjuster disposed on a laser emission path between the semiconductor chip and the laser generator to equalize (i.e., to more uniformly distribute) the intensity of the laser beam to be emitted to the semiconductor chip.

The beam intensity adjuster may include a glass rod disposed in a longitudinal direction along the laser emission path.

Further, the apparatus may include an optical fiber which is connected to the laser generator, and transfers the laser beam emitted from the laser generator to the beam intensity adjuster. In this case, the apparatus may further include an optical fiber unit disposed in the laser emission path between the optical fiber and the beam intensity adjuster, and distributes the laser beam transferred from the optical fiber to parts of one surface of the beam intensity adjuster facing the optical fiber. In addition, the apparatus may further include a laser optical unit which is disposed in the laser emission path between the beam intensity adjuster and the semiconductor chip, and distributes the laser beam passing through the beam intensity adjuster to parts of one surface of the semiconductor chip facing the beam intensity adjuster.

The apparatus may further include first and second focus lenses which are disposed in the laser emission path between the beam intensity adjuster and the semiconductor chip, and adjust the width and length of the laser beam passing through the beam intensity adjuster, respectively.

According to a second aspect of the present invention, a flip chip bonder includes: a bonding stage on which a substrate is placed; a bonding head for picking up a semiconductor chip and bonding the semiconductor chip on the substrate; and a chip heating apparatus for heating the semiconductor chip to a bonding temperature, wherein the chip heating apparatus comprises: a laser generator for emitting a laser beam to a semiconductor chip to heat the semiconductor chip; and a beam intensity adjuster disposed in the laser emission path between the semiconductor chip and the laser generator to equalize the intensity of the laser beam to be emitted to the semiconductor chip throughout an emission region.

The beam intensity adjuster may include a glass rod disposed in a longitudinal direction along the laser emission path.

The chip heating apparatus may further include first and second focus lenses which are disposed in the laser emission path between the beam intensity adjuster and the semiconductor chip, and adjust the width and length of the laser beam passing through the beam intensity adjuster, respectively.

The chip heating apparatus may further include an optical fiber which is connected to the laser generator, and transfers the laser beam emitted from the laser generator to the beam intensity adjuster. In this case, the chip heating apparatus may further include an optical fiber unit disposed in the laser emission path between the optical fiber and the beam intensity adjuster, and distributes the laser beam transferred from the optical fiber to parts of one surface of the beam intensity adjuster facing the optical fiber. Also, the chip heating apparatus may further include a laser optical unit which is disposed in the laser emission path between the beam intensity adjuster and the semiconductor chip, and distributes the laser beam passing through the beam intensity adjuster to parts of one surface of the semiconductor chip facing the beam intensity adjuster.

The bonding head may include: a first barrel mounted with the optical fiber at an upper end part and provided with the beam intensity adjuster therein; a second barrel provided to slide in a vertical direction along an outer circumference of the first barrel; and a third barrel provided to slide in a vertical direction along an outer circumference of the second barrel and formed with a chip pickup part on a bottom thereof to pick up the semiconductor chip. In this case, the chip heating apparatus may further include a first focus lens disposed in a laser emission path between a bottom of the beam intensity adjuster and a bottom of the first barrel to adjust the width of the laser beam passing through the beam intensity adjuster. Further, the chip heating apparatus may further include a second focus lens disposed in a laser emission path between a bottom of the first barrel and a bottom of the second barrel to adjust the length of the laser beam passing through the beam intensity adjuster.

The chip pickup part may include: a vacuum hole opened from the inside of the third barrel toward a bottom of the third barrel to allow the semiconductor chip to be sucked on the bottom of the third barrel; a vacuum line applying vacuum pressure into the third barrel through a lower lateral side of the third barrel to make the vacuum hole have the vacuum pressure; and a blocking glass airtightly dividing the third barrel into a lower part and an upper part to apply the vacuum pressure applied from the vacuum line toward the vacuum hole only.

According to a third aspect of the present invention, a method of bonding a flip chip includes: equalizing the intensity of a laser beam through a beam intensity adjuster disposed in a laser emission path between a semiconductor chip and a laser generator; aligning the semiconductor chip and a substrate to be bonded with the semiconductor chip; emitting the laser beam with uniform intensity to the semiconductor chip; and bonding the semiconductor chip with the substrate.

The beam intensity adjuster may include a glass rod disposed in a longitudinal direction along the laser emission path.

The method may further include: adjusting the width of the laser beam passed through the beam intensity adjuster by a first focus lens disposed in the laser emission path between the beam intensity adjuster and the semiconductor chip.

The method may further include: adjusting the length of the laser beam passed through the beam intensity adjuster by a second focus lens disposed in the laser emission path between the beam intensity adjuster and the semiconductor chip.

The emission of the laser beam toward the semiconductor chip may include: transferring the laser beam emitted from the laser generator to the beam intensity adjuster using an optical fiber connected to the laser generator. In this case, the emission of the laser beam toward the semiconductor chip includes: distributing the laser beam transferred from the optical fiber to parts of one surface of the beam intensity adjuster facing the optical fiber by an optical fiber unit which in the laser emission path between the optical fiber and the beam intensity adjuster. In addition, the emission of the laser beam toward the semiconductor chip may include: distributing the laser beam passed through the beam intensity adjuster to parts of one surface of the semiconductor chip facing the beam intensity adjuster by a laser optical unit which is disposed in the laser emission path between the beam intensity adjuster and the semiconductor chip.

BRIEF DESCRIPTION OF THE DRAWINGS

The above and other features of the present invention will be described in reference to certain exemplary embodiments thereof with reference to the attached drawings in which:

FIG. 10 is a flowchart of a method for bonding a flip chip using the flip chip bonder according to an exemplary embodiment of the present invention; and FIG. 11 is a detailed flowchart of a laser beam emitting operation in FIG. 10.

DETAILED DESCRIPTION OF THE INVENTION

Figure 1:
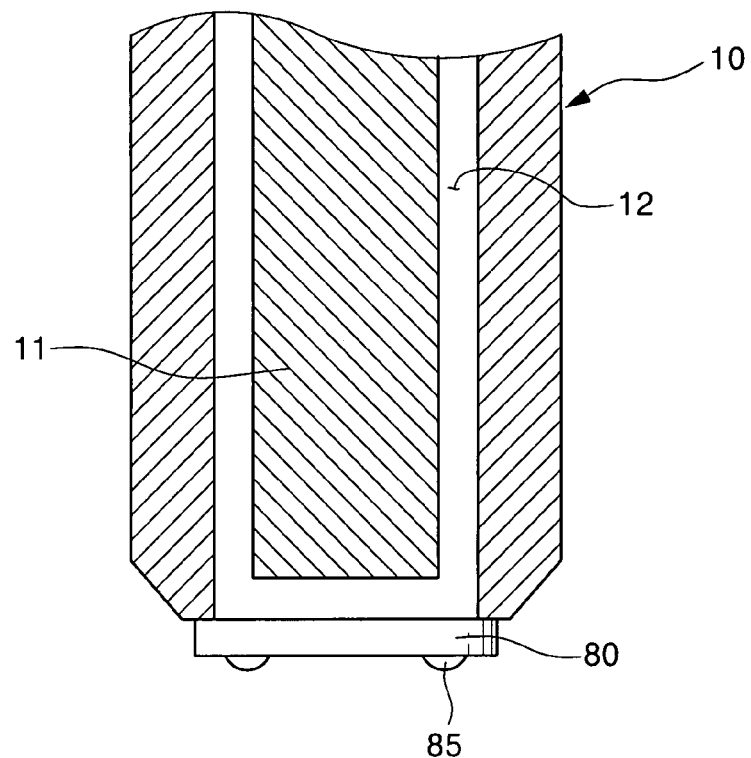
FIG. 1 is a cross-sectional view illustrating an example of a bonding head in a conventional flip chip bonder.
Figure 2:
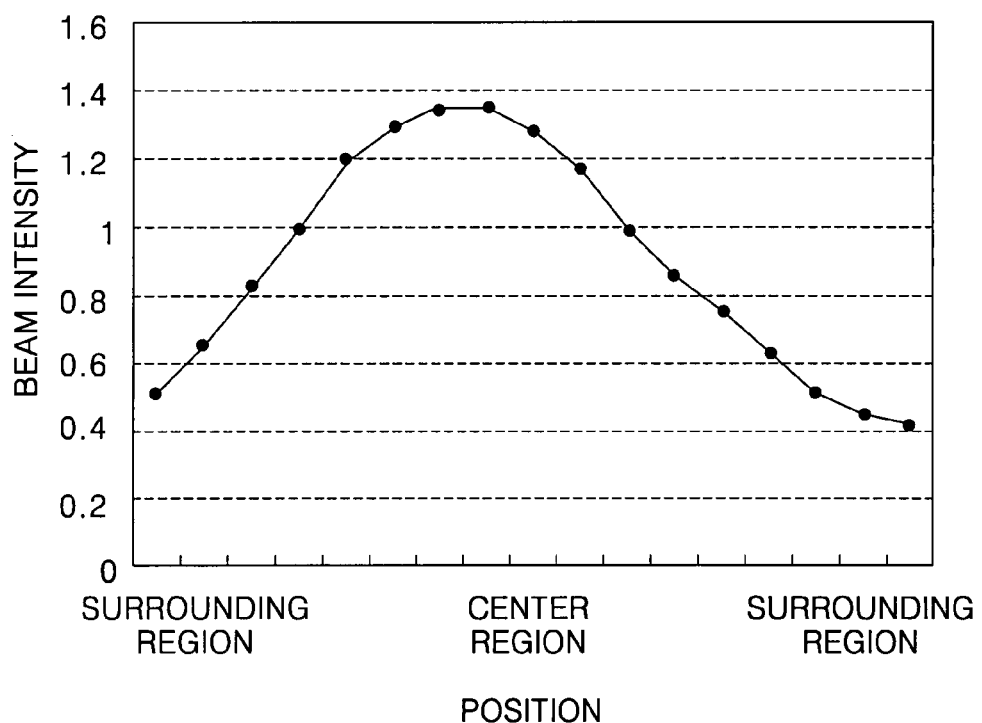
FIG. 2 is a graph showing beam intensity according to positions in a semiconductor chip in the case of using the flip chip bonder of FIG. 1.
Figure 3:
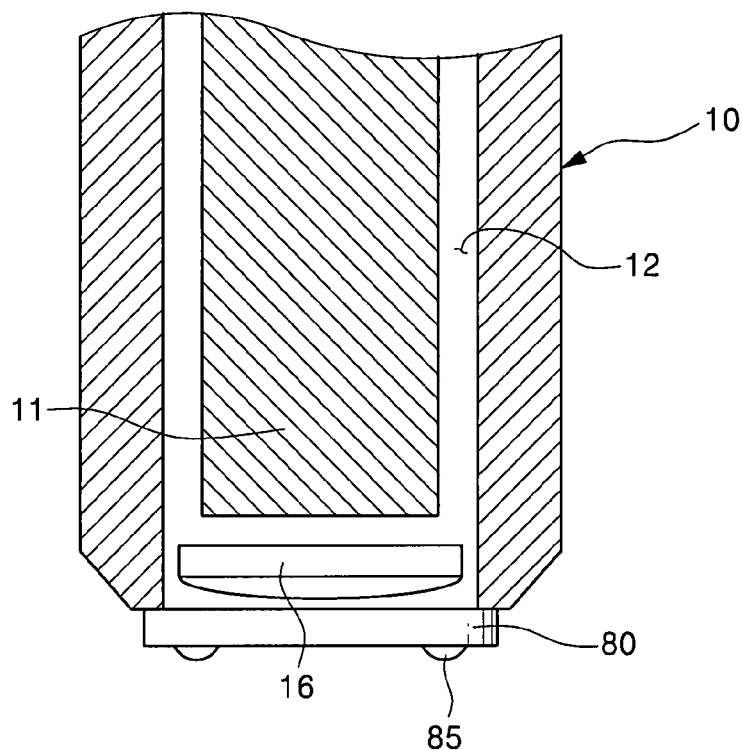
FIG. 3 is a cross-sectional view illustrating another example of a bonding head in a conventional flip chip bonder.
Figure 4:
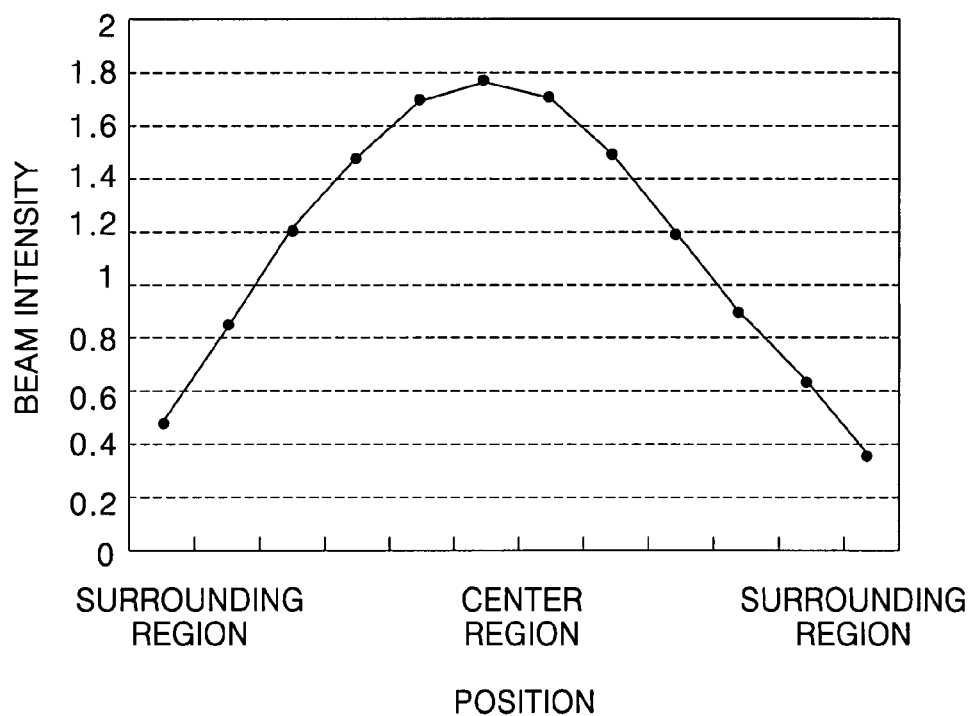
FIG. 4 is a graph showing beam intensity according to positions in a semiconductor chip in the case of using the flip chip bonder of FIG. 3.

Embodiments of the present invention will be described below in more detail with reference to the accompanying drawings. The present invention may, however, be embodied in different forms and should not be construed as being limited to the embodiments set forth herein. Rather, these embodiments are provided to assist one skilled in the art to understand the invention. Like reference numerals refer to like elements throughout the accompanying figures.

Figure 5:
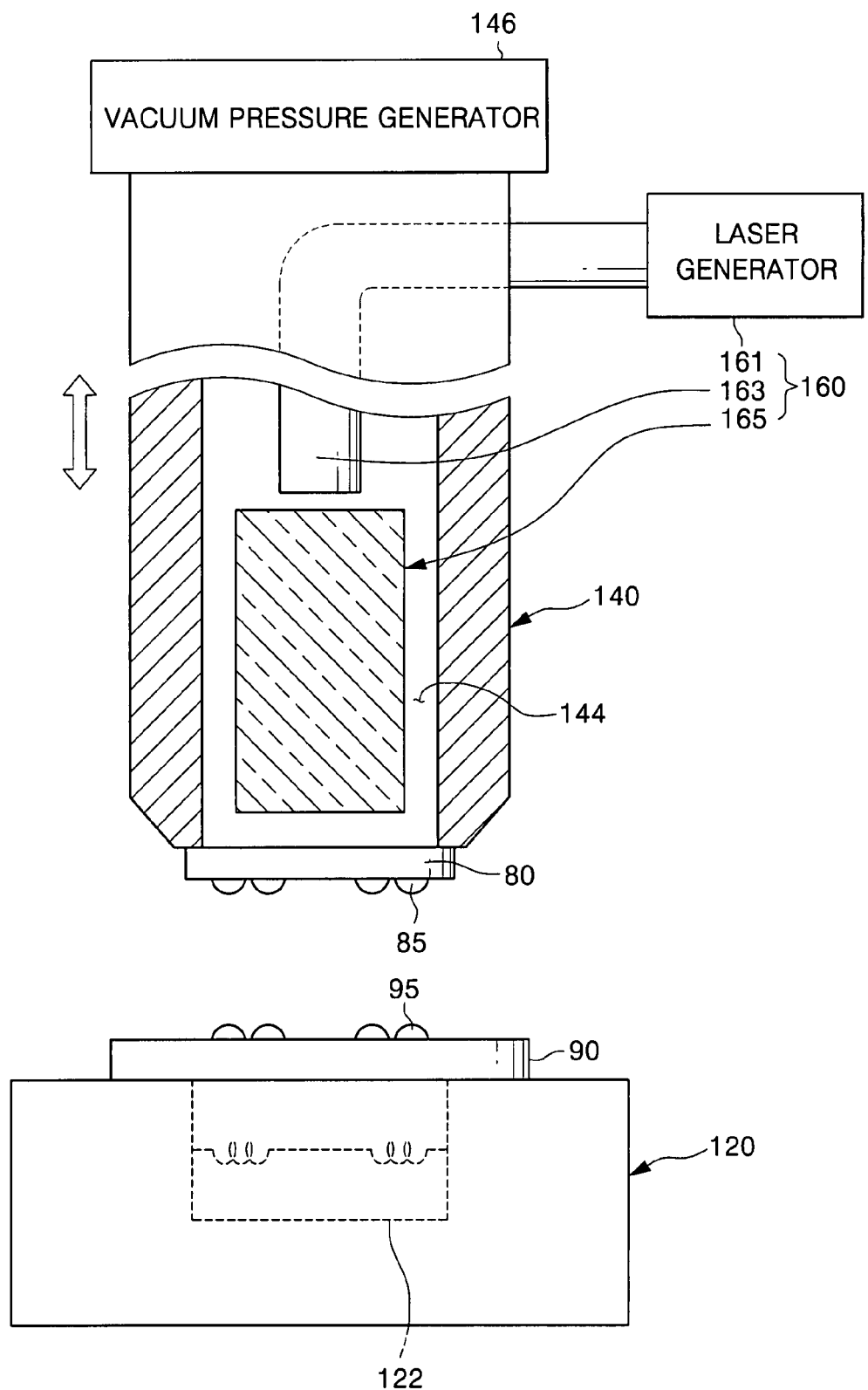
FIG. 5 is a block diagram of a first exemplary embodiment of a flip chip bonder according to the present invention.

Referring to FIG. 5, a flip chip bonder 100 according to a first exemplary embodiment of the present invention includes: a bonding stage 120 on which a substrate 90 formed with a solder bump 95 is placed; a bonding head 140 which is disposed above the bonding stage 120, picks up a semiconductor chip 80 formed with a solder bump 85 from a flip head (not shown) or the like, and bonds the solder bump 85 of the picked-up semiconductor chip 80 to the solder bump 95 of the substrate 90; a chip heating apparatus 160 to heat the semiconductor chip 80 to a melting point of the solder bump, i.e., to a bonding temperature; and a central processing unit (not shown) which controls and drives the flip chip bonder 100.

In more detail, the substrate 90 formed with the solder bump 95 is placed on the bonding stage 120 as its solder bump 95 faces upward. At this time, the bonding stage 120 may use vacuum pressure or the like to hold the substrate 90.

Further, the bonding stage 120 may include a heating unit 122 to heat the substrate 90. In this case, the heating unit 122 heats the substrate 90 so that the bonding can begin more quickly when the semiconductor chip 80 is bonded to the substrate 90. Thus, the solder bump 95 formed on the substrate 90 and the solder bump 85 formed on the semiconductor chip 80 to be bonded to the substrate 90 are heated by the heating unit 122 to a temperature at which they are melted more quickly, so that the bonding between the semiconductor chip 80 and the substrate 90 is performed more quickly.

The bonding head 140 picks up the semiconductor chip 80 supplied from the flip head or the like by vacuum pressure, and carries the picked-up semiconductor chip 80 to a position where the semiconductor chip 80 is aligned with the substrate 90 of the bonding stage 120, i.e., to the bonding position. Then, the bonding head 140 moves the picked-up semiconductor chip 80 downward, thereby bonding the semiconductor chip 80 to the substrate 90.

The bonding head 140 is internally formed with a vacuum passage 144 which is connected to a vacuum pressure generator 146 that creates vacuum pressure. When the vacuum pressure generator 146 generates vacuum pressure, the vacuum pressure is applied to the bottom of the bonding head 140 through the vacuum passage 144. Thus, the semiconductor chip 80 flipped by the flip head 140, i.e., the semiconductor chip 80 with the solder bump 85 facing downward, is attached to the bottom of the bonding head 140 by the vacuum pressure applied through the vacuum passage 144. Then, the bonding head 140 carries the picked-up semiconductor chip 80 to the bonding position to be aligned with the substrate 90, and then moves it down by a predetermined distance, thereby bonding the semiconductor chip 80 to the substrate 90.

After the semiconductor chip 80 is bonded to the substrate 90, the vacuum pressure is temporarily cut off from the bonding head 140 which is lifted up by a predetermined distance, and moves to the flip head that supplied the semiconductor chip 80. Thus, the semiconductor chip 80 and the substrate 90 bonded with the semiconductor chip 80 are not lifted up from the bonding stage 120 because the vacuum pressure is temporarily cut off.

The chip heating apparatus 160 includes a laser generator 161 that generates a laser beam and emits it toward the semiconductor chip 80, an optical fiber 163 that transfers the laser beam from the laser generator 161 to the semiconductor chip 80, and a beam intensity adjuster 165 that is disposed in a laser emission path between the semiconductor chip 80 and the laser generator 161 to equalize the intensity of the laser beam emitted toward the semiconductor chip 80.

The laser generator 161 generates a laser beam having a certain wavelength for example, a wavelength of about 1064 nm for silicon (Si), which is emitted toward the semiconductor chip 80. However, the present invention is not limited to the laser generator 161 for the foregoing wavelength. Alternatively, the present invention may employ various laser generators as long as it emits a laser beam having a wavelength to heat the semiconductor chip 80.

Further, the optical fiber 163 has a first end connected to the laser generator 161 and a second end penetrating the bonding head 140 and which extends to a position adjacent to the beam intensity adjuster 165. Thus, the optical fiber 163 transfers the laser beam emitted from the laser generator 161 to the beam intensity adjuster 165 through the inside of the bonding head 140.

The beam intensity adjuster 165 is disposed in the laser emission path between the optical fiber 163 transmitting the laser beam and the semiconductor chip 80, and equalizes the intensity of the laser beam emitted to the semiconductor chip 80. In this embodiment, the optical fiber 163 is disposed inside the bonding head 140 and the semiconductor chip 80 is attached to the bottom of the bonding head 140, so that the beam intensity adjuster 165 is disposed in the laser emission path between the optical fiber 163 and the semiconductor chip 80 inside the bonding head 140, thereby equalizing the intensity of the laser beam emitted toward the semiconductor chip 80.

The beam intensity adjuster 165 may have various shapes and configurations. The beam intensity adjuster 165 may be embodied by a glass rod having a cross-section of various shapes, such as a square, circle or polygon shape. Preferably, the beam intensity adjuster 165 may be embodied by a glass rod having a cross-section that corresponds substantially to the shape of the semiconductor chip. As a result, the cross-sectional shape of the beam intensity adjuster may be substantially similar to the shape of the semiconductor chip.

For example, the beam intensity adjuster 165 may be embodied by a glass rod which is elongated along the laser emission path. In this case, the laser beam transferred through the optical fiber 163 passes through the glass rod formed along the laser emission path and is then emitted toward the semiconductor chip 80. At this time, the laser beam is reflected and scattered repetitively several times, dozens of times or hundreds of times while passing through the glass rod. As a result, the intensity of the laser beam is generally equalized after passing through the glass rod, so that the equalized laser beam is emitted to the semiconductor chip 80.

Figure 6:
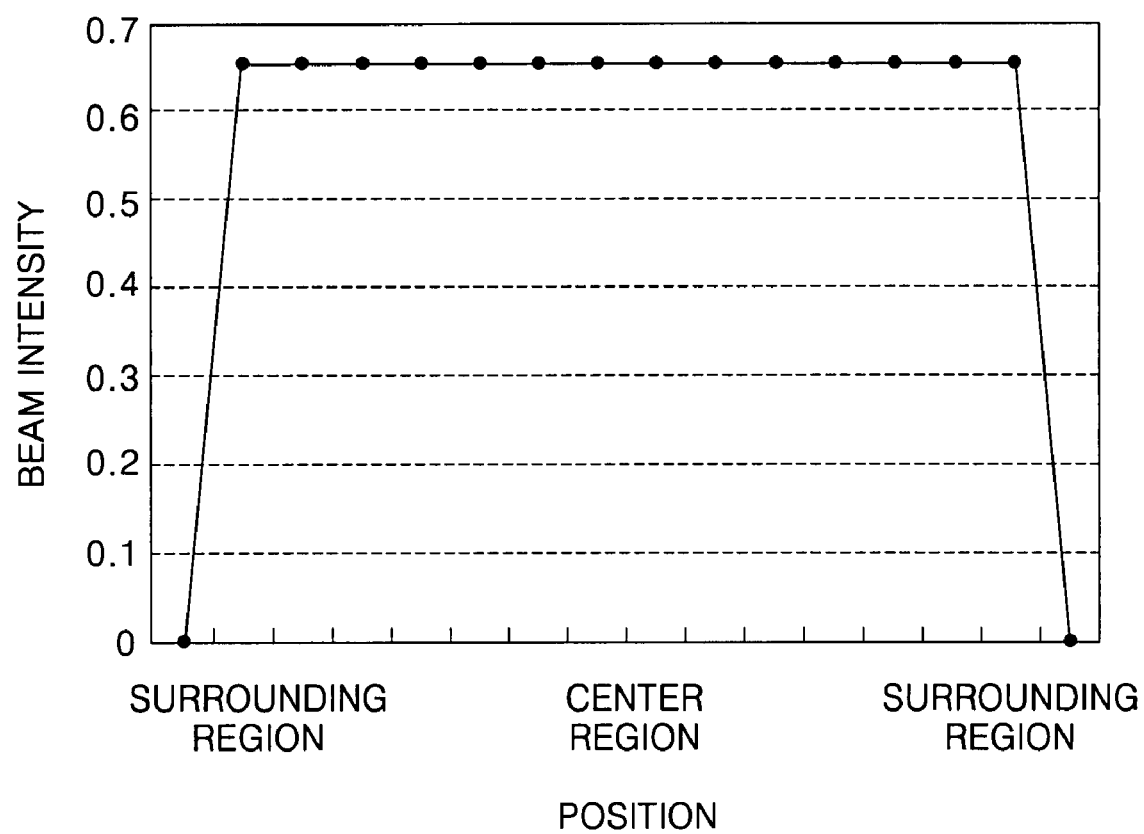
FIG. 6 is a graph showing beam intensity according to positions in a semiconductor chip in the case of using the flip chip bonder of FIG. 5.

FIG. 6 is a graph showing beam intensity according to positions in a semiconductor chip in the case of using the flip chip bonder of FIG. 5. Referring to FIG. 6, when the semiconductor chip 80 is heated by the laser beam, the beam intensity adjuster 165, i.e., the glass rod more uniformly transmits the laser beam to the semiconductor chip 80 from a center region toward a surrounding region. Thus, in the case that the flip chip bonder 100 according to the first exemplary embodiment of the present invention is used in the flip chip bonding process, the laser beam energy is uniformly distributed to the semiconductor chip 80, thereby solving problems such as damage to the semiconductor chip, deterioration in bonding quality, etc.

Figure 7:
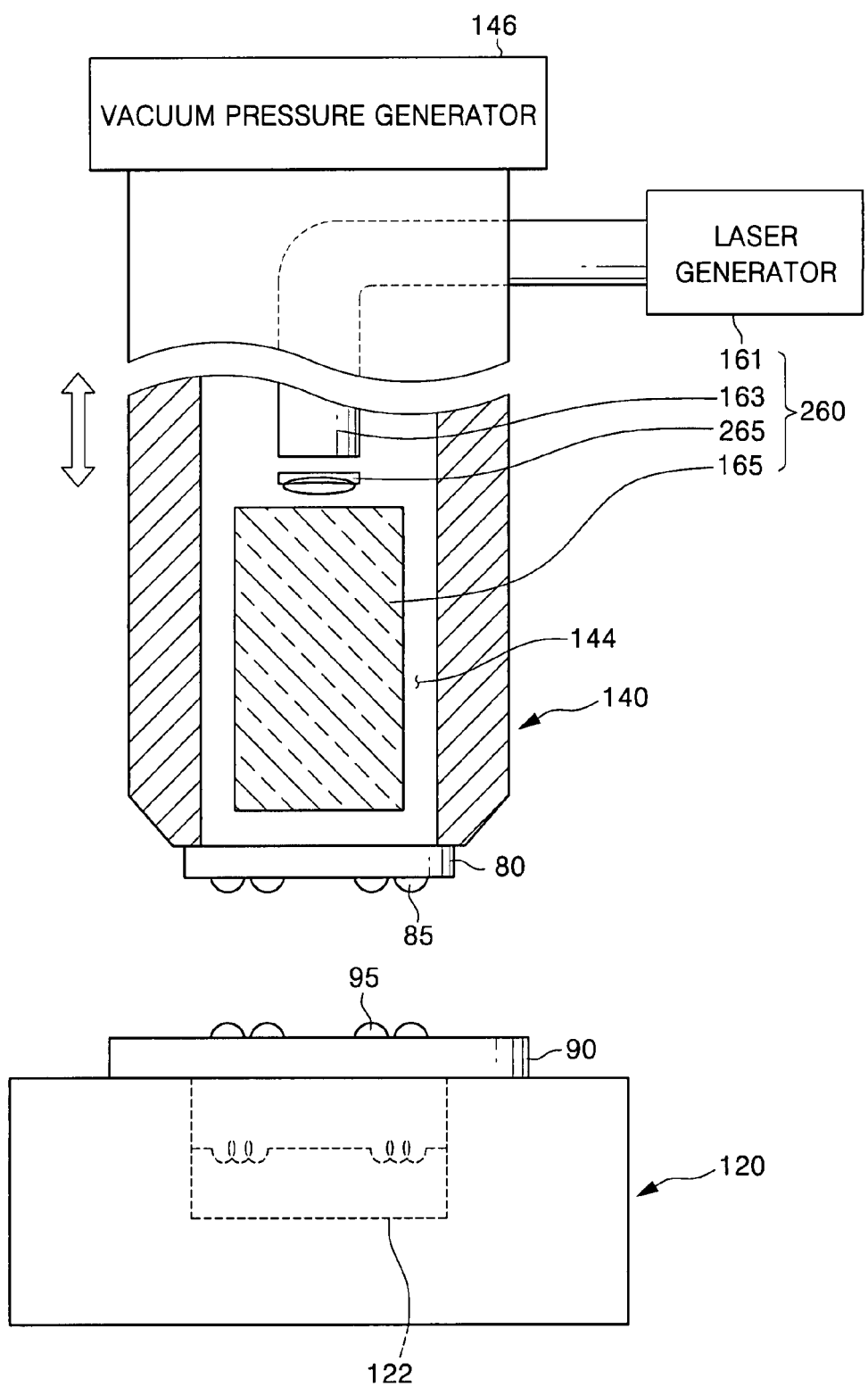
FIG. 7 is a block diagram of a second exemplary embodiment of a flip chip bonder according to the present invention.

Referring to FIG. 7, a flip chip bonder 200 according to a second exemplary embodiment of the present invention is shown and further includes an optical fiber unit 265 disposed in the laser emission path between an optical fiber 163 and a beam intensity adjuster 165 in addition to the elements of the flip chip bonder 100 according to the first exemplary embodiment. The optical fiber unit 265 gathers the laser beam transferred from optical fiber 163 and distributes the laser beam to parts of one surface of the beam intensity adjuster 165 facing the optical fiber 163. The optical fiber unit 265 may be comprised of a lens or lens assembly having lenses and a lens barrel.

In this case, the optical fiber unit 265 is disposed between the optical fiber 163 and the beam intensity adjuster 165 inside the bonding head 140, and distributes the laser beam transferred from the optical fiber 163 to parts of one surface of the beam intensity adjuster 165 facing the optical fiber 163.

Using the flip chip bonder 200 according to the second exemplary embodiment of the present invention, the semiconductor chip is heated by the laser beam with more uniform intensity. The reference numeral "360" denotes the various elements that comprise the chip heating apparatus according to the second exemplary embodiment of the present invention.

Figure 8:
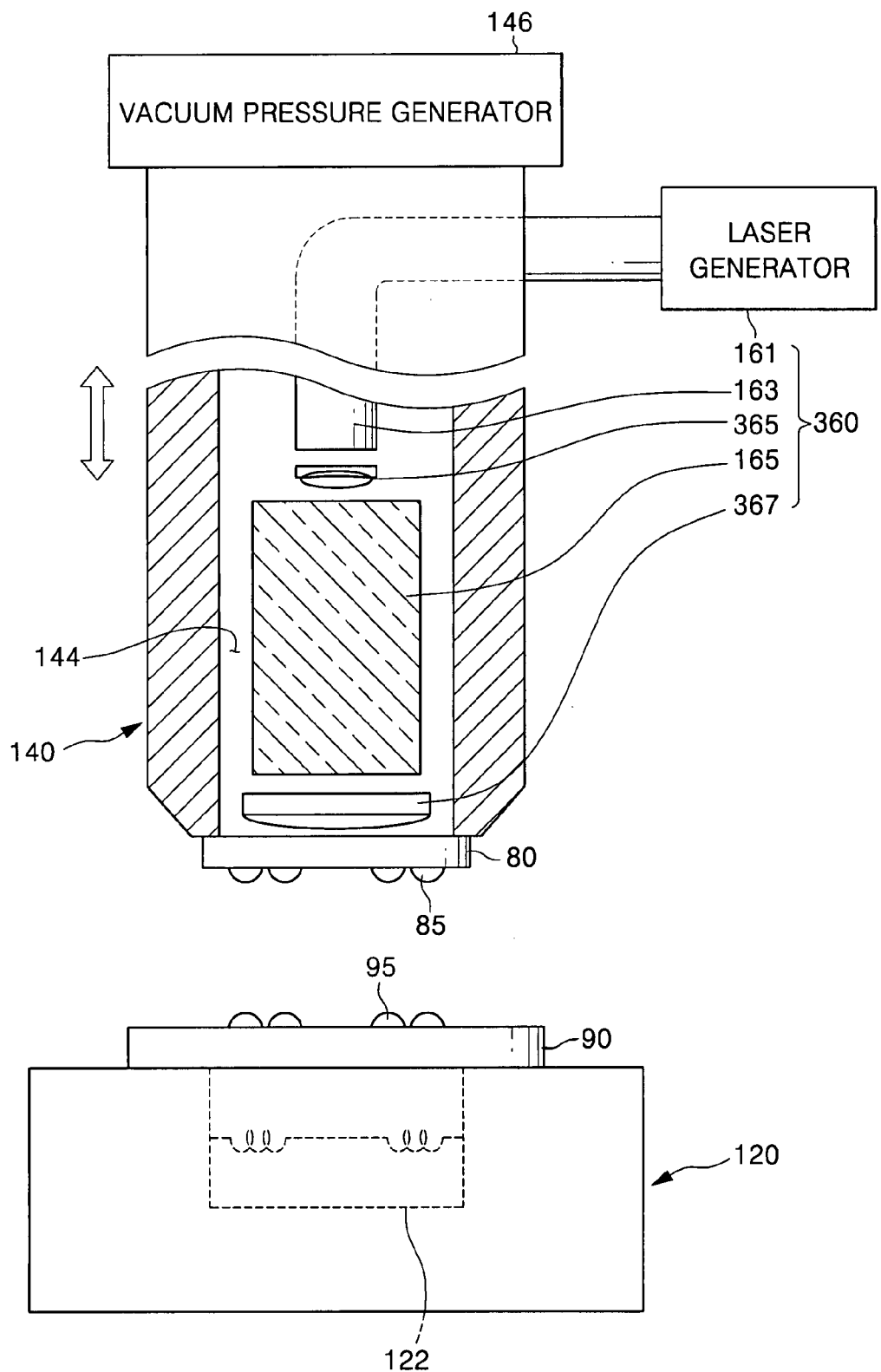
FIG. 8 is a block diagram of a third exemplary embodiment of a flip chip bonder according to the present invention.

Referring to FIG. 8, a flip chip bonder 300 according to the third exemplary embodiment of the present invention is shown and further includes an optical fiber unit 365 disposed in the laser emission path between an optical fiber 163 and a beam intensity adjuster 165, and a laser optical unit 367 also disposed in the laser emission path between the beam intensity adjuster 165 and the semiconductor chip 80, in addition to the elements of the flip chip bonder 100 according to the first exemplary embodiment.

In this case, the optical fiber unit 365 is disposed between the optical fiber 163 and the beam intensity adjuster 165 inside the bonding head 140, and distributes the laser beam transferred from the optical fiber 163 to parts of one surface of the beam intensity adjuster 165 facing the optical fiber 163. Further, the laser optical unit 367 is disposed between the beam intensity adjuster 165 and the semiconductor chip 80 inside the bonding head 140, and distributes the laser beam passing through the beam intensity adjuster 165 to parts of one surface of the semiconductor chip 80 facing the beam intensity adjuster 165. The laser optical unit 367 distributes the laser beam passing through the beam intensity adjuster 165 to parts of one surface of the semiconductor chip 80 facing the beam intensity adjuster 165 and adjusts the width and length of the laser beam passing through the beam intensity adjuster 165. The laser optical unit 367 may be comprised of a lens or lens assembly having lenses and a lens barrel. The configuration of the laser optical unit 367 may vary according to the shape or size of the semiconductor chip.

Using the flip chip bonder 300 according to the third exemplary embodiment of the present invention, the semiconductor chip is heated by the laser beam with more uniform intensity. The reference numeral "360" indicates the various elements that comprise the chip heating apparatus according to the third exemplary embodiment of the present invention.

Figure 9:
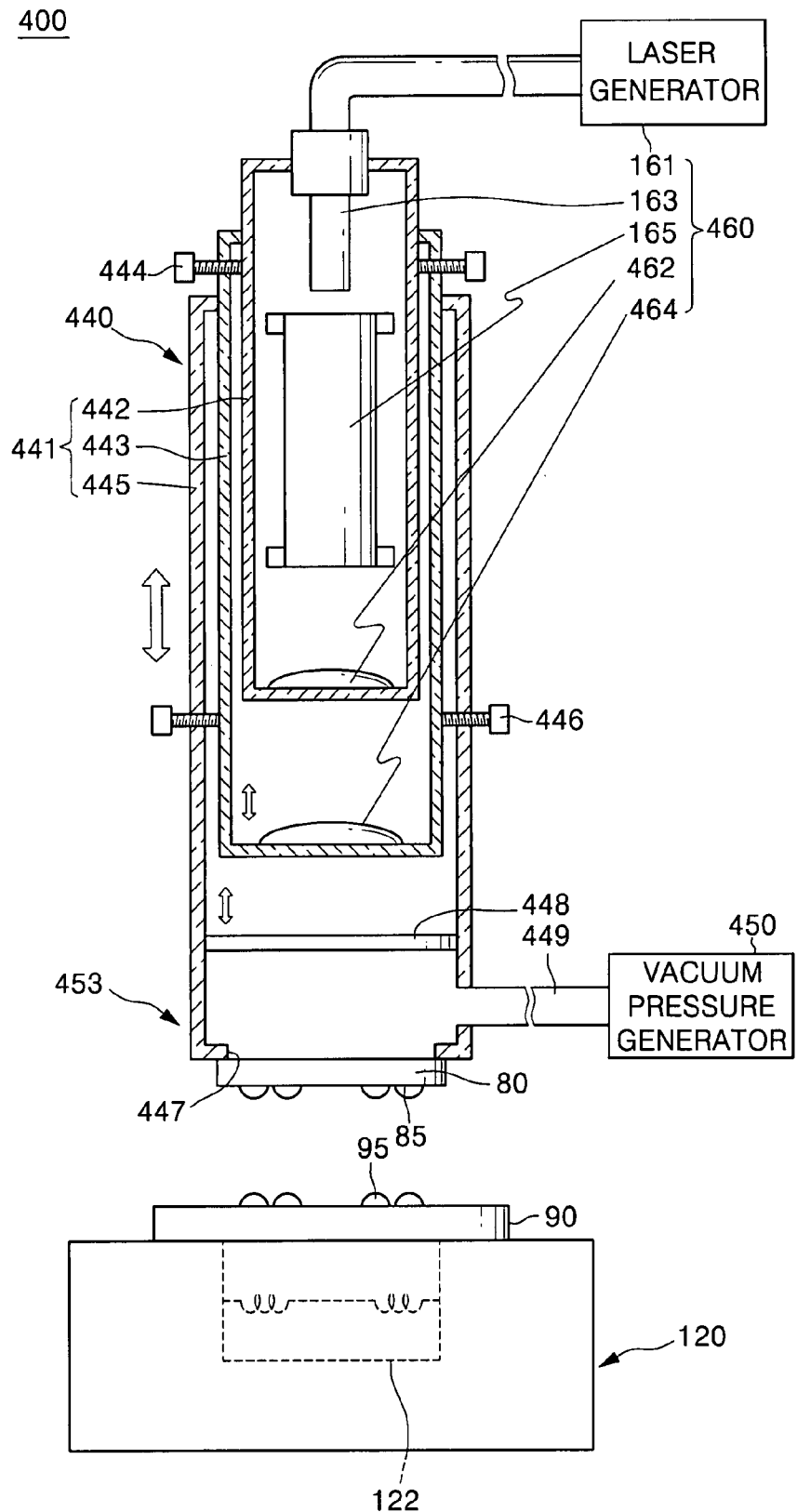
FIG. 9 is a block diagram of a fourth exemplary embodiment of a flip chip bonder according to the present invention.

Referring to FIG. 9, a flip chip bonder 400 according to the fourth exemplary embodiment of the present invention is shown and further includes a bonding head 440 provided with a barrel assembly 441 to pick up the semiconductor chip 80, and a chip heating apparatus 460 adjusting the width, the length, etc. of the laser beam to be emitted on to and to heat the semiconductor chip 80, in addition to a bonding stage 120 on which a substrate 90 is seated.

The barrel assembly 441 includes a plurality of barrels adjustable in vertical length, i.e., a first barrel 442 disposed in a longitudinal direction along the laser emission path, a second barrel 443 provided on an outer circumference of the first barrel 442 and sliding in a longitudinal direction of the first barrel 442, and a third barrel 445 provided on an outer circumference of the second barrel 443 and sliding in a longitudinal direction of the second barrel 443.

The optical fiber 163 has a first end connected to the laser generator 161 and is provided in a top portion of the first barrel 442. The beam intensity adjuster 165 is provided inside the first barrel 442, i.e., below the optical fiber 163. In the flip chip bonder 400 according to the fourth exemplary embodiment of the present invention, the laser beam transferred through the optical fiber 163 is also emitted to the semiconductor chip via the beam intensity adjuster 165.

Like the first barrel 442, the second barrel 443 is disposed in a longitudinal direction along the laser emission path and capable of sliding in the vertical direction along the outer circumference of the first barrel 442. Further, the second barrel 443 is selectively fastened to the outer circumference of the first barrel 442 by a pair of first fastening pins 444 penetrating a lateral side of the second barrel 443. Accordingly, the first fastening pin 444 is released from the outer circumference of the first barrel 442 when the second barrel 443 is required to slide, and fastened to the outer circumference of the first barrel 442 when the second barrel 443 is required to stop.

Like the first and second barrels 442 and 443, the third barrel 445 is disposed in a longitudinal direction along the laser emission path and capable of sliding in the vertical direction along the outer circumference of the second barrel 443. Further, the third barrel 445 is selectively fastened to the outer circumference of the second barrel 443 by a pair of second fastening pins 446 penetrating a lateral side of the third 445. Accordingly, the second fastening pin 446 is released from the outer circumference of the second barrel 443 when the third barrel 445 is required to slide, and fastened to the outer circumference of the second barrel 443 when the third barrel 445 is required to stop.

Further, a chip pickup part 453 is provided below the third barrel 445 and picks up the semiconductor chip 80. In this embodiment, the chip pickup part 453 includes a vacuum hole 447 opened from the inside toward a bottom of the third barrel 445 and allowing the semiconductor chip 80 to be sucked on the bottom of the third barrel 445; a vacuum line 449 applying the vacuum pressure from the vacuum pressure generator 161 into the third barrel 445 through a lower lateral side of the third barrel 445 so as to make the vacuum hole 447 have the vacuum pressure; and a blocking glass 448 airtightly dividing the third barrel 445 into a lower part and an upper part so as to make the vacuum pressure be applied from the vacuum line 449 to the vacuum hole 447 only. Thus, the semiconductor chip 80 supplied from the flip head or the like is sucked by the chip pickup part 453 provided on the bottom of the third barrel 445.

The chip heating apparatus 460 includes: the laser generator 161 that generates the laser beam and emits it toward the semiconductor chip 80; the optical fiber 163 that is disposed between the laser generator 161 and the semiconductor chip 80 and transfers the laser beam from the laser generator 161 to the semiconductor chip 80; the beam intensity adjuster 165 that is disposed in the laser emission path between the semiconductor chip 80 and the optical fiber 163 in order to equalize the intensity of the laser beam emitted toward the semiconductor chip 80; and first and second focus lenses 462 and 464 that are disposed in the laser emission path between the beam intensity adjuster 165 and the semiconductor chip 80, and adjust the width and the length of the laser beam passing through the beam intensity adjuster 165, respectively.

As described above, the optical fiber 163 is placed in an upper end part of the first barrel 442, and the beam intensity adjuster 165 is placed inside the first barrel 442, i.e., below the optical fiber 163.

The first focus lens 462 is disposed in the laser emission path between the bottom of the beam intensity adjuster 165 and the bottom of the first barrel 442, for example, disposed on the bottom of the first barrel 442, and adjusts the width of the laser beam passing through the beam intensity adjuster 165. To adjust the width of the laser beam passing through the beam intensity adjuster 165, the second barrel 443 may slide with respect to the first barrel 442 by a predetermined distance, or the third barrel 445 may slide with respect to the second barrel 443 by a predetermined distance, thereby controlling the distance between the semiconductor chip 80 sucked on the bottom of the third barrel 445 and the first focus lens 462.

The second focus lens 464 is disposed in the laser emission path between the bottom of the first barrel 442 and the bottom of the second barrel 443, for example, disposed on the bottom of the second barrel 443, and adjusts the length of the laser beam passing through the beam intensity adjuster 165. To adjust the length of the laser beam passing through the beam intensity adjuster 165, the third barrel 445 may slide with respect to the second barrel 443 by a predetermined distance, thereby controlling the distance between the semiconductor chip 80 sucked on the bottom of the third barrel 445 and the second focus lens 464.

Using the flip chip bonder 400 according to the fourth exemplary embodiment of the present invention, the semiconductor chip is heated by the laser beam with more uniform intensity. Further, the width, the length, etc. of the laser beam is adjustable according to the size of the semiconductor chip.

Below, a method of bonding a flip chip using the flip chip bonder according to an exemplary embodiment of the present invention will be described with reference to FIGS. 10 and 11.

Turning to FIG. 10, before emitting the laser beam to the semiconductor chip 80, the intensity of the laser beam to be emitted to the semiconductor chip 80 is adjusted in step S20 by adjusting the beam intensity adjuster 165 such as the glass rod between the semiconductor chip 80 and the laser generator 161, thereby adjusting the intensity of the laser beam to be emitted toward the semiconductor chip 80.

After adjusting the intensity of the laser beam, the first focus lens 462 may be moved up and down on the laser emission path between the beam intensity adjuster 165 and the semiconductor chip 80, thereby adjusting the laser beam passing through the beam intensity adjuster 165 to have a correct width to heat the semiconductor chip 80 to be bonded in step S30.

Then, the second focus lens 464 may be moved up and down on the laser emission path between the beam intensity adjuster 165 and the semiconductor chip 80, thereby adjusting the laser beam passing through the beam intensity adjuster 165 to have a length proper to heat the semiconductor chip 80 to be bonded in step S40. Thus, the laser beam of which the intensity is adjusted by the beam intensity adjuster 165 is adjusted again by the first and second focus lenses 462 and 464 to have the width and the length proper to heat the semiconductor chip 80 to be bonded.

After the intensity, the width and the length of the laser beam to be emitted to the semiconductor chip 80 is adjusted, the semiconductor chip 80 and the substrate 90 are aligned with each other in step S50. At this time, the solder bumps 85 of the semiconductor chip 80 are aligned with and contact the corresponding solder bumps 95 of the substrate 90.

After aligning the semiconductor chip 80 with the substrate 90, the laser generator 161 emits the laser beam toward the semiconductor chip 80 in step S60. At this time, the laser beam is previously adjusted to have a proper intensity, a proper width and a proper length, so that the laser beam is optimized to heat the semiconductor chip 80. As a result, the solder bumps 85 of the semiconductor chip 80 and the solder bumps 95 of the substrate 90 are melted and bonded with each other while the semiconductor chip 80 is uniformly heated.

To more smoothly perform the bonding between the semiconductor chip 80 and the substrate 90, a predetermined pressure may be applied to the semiconductor chip 80. In this case, the pressure may be caused as the bonding heads 140 and 440 that suck and align the semiconductor chip 80 move down.

Meanwhile, step S60 of emitting the laser beam toward the semiconductor chip 80 so as to heat the semiconductor chip 80 may include the following detailed operations as shown in FIG. 11.

Step S60 of emitting the laser beam toward the semiconductor chip 80 may include: step S610 of transferring the laser beam from the laser generator 161 to the beam intensity adjuster 165 through the optical fiber 163 connected to the laser generator 161; step S620 of distributing the laser beam transferred from the optical fiber 163 to parts of one surface of the beam intensity adjuster 165 facing the optical fiber 163 through the optical fiber units 265 and 365 disposed on the laser emission path between the optical fiber 163 and the beam intensity adjuster 165; and step S630 of distributing the laser beam passing through the beam intensity adjuster 165 to parts of one surface of the semiconductor chip 80 facing the beam intensity adjuster 165 through the laser optical unit 367 disposed in the laser emission path between the beam intensity adjuster 165 and the semiconductor chip 80.

In this case, a laser beam with more uniform intensity is emitted to the semiconductor chip 80, and thus the semiconductor chip 80 is uniformly heated.

As described above, the present invention provides an apparatus for heating a chip, in which a laser beam is emitted to a semiconductor chip with more uniform intensity, thereby more uniformly heating the semiconductor chip.

Further, the present invention provides a flip chip bonder and a method for bonding a flip chip using the same, in which a semiconductor is heated by a laser beam with uniform intensity, so that energy of the laser beam for heating the semiconductor chip is uniformly distributed in the semiconductor chip, thereby uniformly heating the semiconductor chip.

Accordingly, the present invention prevents the semiconductor chip from being damaged or deteriorated in bonding quality due to non-uniform energy distribution.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A flip chip bonder comprising:
a bonding stage on which a substrate is placed;
a bonding head for picking up a semiconductor chip and bonding the semiconductor chip on the substrate; and
a chip heating apparatus for heating the semiconductor chip to a bonding temperature,
wherein the chip heating apparatus comprises:
a laser generator for emitting a laser beam to a semiconductor chip to heat the semiconductor chip;
a beam intensity adjuster disposed in the laser emission path between the semiconductor chip and the laser generator to equalize the intensity of the laser beam to be emitted to the semiconductor chip throughout an emission region;
wherein the chip heating apparatus further comprises an optical fiber connected to the laser generator to transfer the laser beam emitted from the laser generator to the beam intensity adjuster;
the flip-chip bonder further comprising:
a first barrel mounted with the optical fiber at an upper end part and provided with the beam intensity adjuster therein;
a second barrel provided to slide in a vertical direction along an outer circumference of the first barrel; and
a third barrel provided to slide in a vertical direction along an outer circumference of the second barrel and formed with a chip pickup part on a bottom thereof to pick up the semiconductor chip.

2. The flip chip bonder as claimed in claim 1, wherein the chip heating apparatus further comprises a first focus lens disposed on a laser emission path between a bottom of the beam intensity adjuster and a bottom of the first barrel to adjust the width of the laser beam passing through the beam intensity adjuster.

3. The flip chip bonder as claimed in claim 1, wherein the chip pickup part comprises:
a vacuum hole opened from the inside of the third barrel toward a bottom of the third barrel to allow the semiconductor chip to be sucked on the bottom of the third barrel;
a vacuum line applying vacuum pressure into the third barrel through a lower lateral side of the third barrel to make the vacuum hole have the vacuum pressure; and
a blocking glass airtightly dividing the third barrel into a lower part and an upper part to apply the vacuum pressure applied from the vacuum line toward the vacuum hole only.

4. The flip chip bonder as claimed in claim 1, wherein the beam intensity adjuster comprises a glass rod which is elongated along the laser emission path.

5. The flip chip bonder as claimed in claim 2, wherein the chip heating apparatus further comprises a second focus lens disposed on a laser emission path between a bottom of the first barrel and a bottom of the second barrel to adjust the length of the laser beam passing through the beam intensity adjuster.

* * * * *